United States Patent
Seong et al.

(10) Patent No.: US 10,886,045 B2
(45) Date of Patent: Jan. 5, 2021

(54) FERRITE SHEET, METHOD FOR MANUFACTURING SAME, AND ELECTRONIC COMPONENT COMPRISING SAME

(71) Applicant: EMW CO., LTD., Incheon (KR)

(72) Inventors: Won Mo Seong, Gyeonggi-do (KR); In Seung Baek, Gyeonggi-do (KR)

(73) Assignee: EMW CO., LTD., Incheon (KR)

( * ) Notice: Subject to any disclaimer, the term of this patent is extended or adjusted under 35 U.S.C. 154(b) by 168 days.

(21) Appl. No.: 15/577,939

(22) PCT Filed: May 30, 2016

(86) PCT No.: PCT/KR2016/005708
§ 371 (c)(1),
(2) Date: Nov. 29, 2017

(87) PCT Pub. No.: WO2016/195350
PCT Pub. Date: Dec. 8, 2016

(65) Prior Publication Data
US 2018/0166193 A1    Jun. 14, 2018

(30) Foreign Application Priority Data

Jun. 1, 2015 (KR) .......................... 10-2015-0077620

(51) Int. Cl.
*H01F 1/36* (2006.01)
*H05K 9/00* (2006.01)
(Continued)

(52) U.S. Cl.
CPC ............... *H01F 1/36* (2013.01); *B32B 9/005* (2013.01); *B32B 9/045* (2013.01); *H01F 1/11* (2013.01);
(Continued)

(58) Field of Classification Search
None
See application file for complete search history.

(56) References Cited

U.S. PATENT DOCUMENTS 4,699,840 A * 10/1987 Yashiro ............... G11B 5/70678
252/62.54
5,480,732 A * 1/1996 Aoki ..................... G11B 5/716
428/839.3
(Continued)

FOREIGN PATENT DOCUMENTS

| JP | 1993-182087 A | 7/1993 |
| JP | 11-067522 A | 3/1999 |

(Continued)

OTHER PUBLICATIONS

International Search Report for PCT/KR2016/005708.
(Continued)

*Primary Examiner* — Kevin M Bernatz
(74) *Attorney, Agent, or Firm* — The PL Law Group, PLLC

(57) ABSTRACT

A ferrite sheet includes acicular ferrite powder, and has a uniaxially-oriented magnetic direction. The ferrite sheet is capable of remarkably increasing magnetic permeability and saturation magnetization, and accordingly is capable of remarkably improving the power efficiency of an electronic device by minimizing magnetic field leakage when being applied to a shielding sheet.

7 Claims, 1 Drawing Sheet

(51) Int. Cl.
*H01F 41/02* (2006.01)
*H01F 10/20* (2006.01)
*B32B 9/00* (2006.01)
*B32B 9/04* (2006.01)
*H01F 1/11* (2006.01)
*H01F 41/00* (2006.01)

(52) U.S. Cl.
CPC ............ *H01F 10/20* (2013.01); *H01F 41/00* (2013.01); *H01F 41/0206* (2013.01); *H05K 9/0075* (2013.01); *H05K 9/0083* (2013.01); *B32B 2405/00* (2013.01)

(56) References Cited

U.S. PATENT DOCUMENTS

| | | | | |
|---|---|---|---|---|
| 5,990,417 | A * | 11/1999 | Senda | H01F 17/06 174/391 |
| 6,428,884 | B1 * | 8/2002 | Naoe | G11B 5/70 428/323 |
| 9,418,780 | B2 * | 8/2016 | Oikawa | H01F 1/26 |
| 2003/0190498 | A1 * | 10/2003 | Fujieda | H01L 23/552 428/8 |
| 2008/0101979 | A1 * | 5/2008 | Kato | H01F 1/348 420/8 |
| 2010/0000769 | A1 * | 1/2010 | Ohmi | H01F 1/26 174/255 |
| 2010/0181522 | A1 * | 7/2010 | Kim | C23C 18/1639 252/62.55 |
| 2012/0021219 | A1 * | 1/2012 | Gabay | B22F 1/0018 428/402 |
| 2013/0063296 | A1 * | 3/2013 | Hennig | H01Q 1/245 342/1 |
| 2014/0176380 | A1 * | 6/2014 | Choi | H01Q 1/38 343/787 |
| 2015/0093600 | A1 * | 4/2015 | Hosoya | G11B 5/70678 428/842.3 |
| 2016/0086700 | A1 * | 3/2016 | Suetsuna | H01F 1/0063 252/62.56 |
| 2016/0167978 | A1 * | 6/2016 | Christensen | B08B 9/032 423/594.2 |
| 2016/0276076 | A1 * | 9/2016 | Kasada | G11B 5/7085 |
| 2018/0258513 | A1 * | 9/2018 | Suetsuna | H01F 1/24 |

FOREIGN PATENT DOCUMENTS

| | | |
|---|---|---|
| JP | 5182087 B2 | 4/2013 |
| KR | 10-2012-0008332 A | 1/2012 |
| KR | 10-2013-0137517 A | 12/2013 |
| KR | 10-2014-0090337 A | 7/2014 |

OTHER PUBLICATIONS

Notice of Allowance dated Mar. 6, 2017 from Korean Patent Office in a counterpart Korean Patent Application No. 10-2015-0077620 (all the cited references are listed in this IDS.) (English translation is also submitted herewith.).

* cited by examiner

FERRITE SHEET, METHOD FOR MANUFACTURING SAME, AND ELECTRONIC COMPONENT COMPRISING SAME

CROSS REFERENCE TO RELATED APPLICATIONS AND CLAIM OF PRIORITY

This application claims benefit under 35 U.S.C. 119(e), 120, 121, or 365(c), and is a National Stage entry from International Application No. PCT/KR2016/005708, filed May 30, 2016, which claims priority to the benefit of Korean Patent Application No. 10-2015-0077620 filed in the Korean Intellectual Property Office on Jun. 1, 2015, the entire contents of which are incorporated herein by reference.

TECHNICAL FIELD

The present invention relates to a ferrite sheet, a method for manufacturing the same, and an electronic component comprising the same.

BACKGROUND ART

Generally, electromagnetic waves (or radiated noise) generated in an electronic device cause malfunction of peripheral electronic devices, and, when a human body is exposed to the electromagnetic waves, the electromagnetic waves adversely affect health of the human body. Therefore, in order to block electromagnetic waves generated from an electronic device, the electronic device is used and equipped with an electromagnetic wave shielder made of a magnetic material such as ferrite.

A shield cap is formed at a circuit module installed in a mobile communication terminal, and, when a ferrite sheet complex is formed on the shield cap to form an electromagnetic wave shielder, electromagnetic waves generated from the circuit module can be effectively blocked.

Specifically, in a magnetic body used for wireless charging and near-field communication, a magnetization direction of a material should easily react according to a phase change of an external alternating magnetic field. The magnetic body attracts the magnetic field distributed in space into the material to form a magnetic circuit having high density magnetic flux, thereby serving to shield the electromagnetic waves from a body and a battery of a portable terminal.

Magnetic permeability, which is a magnetic property, is an index that indicates a degree of increase of the magnetic flux, and a magnetic body having high magnetic permeability is required to minimize leakage of a magnetic field.

Korean Patent Application Publication No. 2012-0008332 discloses a ferrite sheet complex and a manufacturing method thereof.

SUMMARY

It is an objective of the present invention to provide a ferrite sheet in which magnetic permeability and saturation magnetization are significantly increased.

It is another objective of the present invention to provide a ferrite sheet capable of improving power efficiency with a superior shielding effect when applied to electronic devices.

Also, it is still another objective of the present invention to provide a method for manufacturing a ferrite sheet and a ferrite sheet complex including the ferrite sheet.

Further, it is yet another objective of the present invention to provide an electronic component with a ferrite sheet.

1. A ferrite sheet contains acicular ferrite powder and has a uniaxially-oriented magnetic direction.

2. In the above 1, the ferrite powder may include at least one selected from hard ferrite and soft ferrite.

3. In the above 2, the soft ferrite may be at least one selected from among Ni—Zn based ferrite, Ni—Zn—Cu based ferrite, Mn—Zn based ferrite, Mg—Zn based ferrite, and Ni—Mn—Zn based ferrite.

4. In the above 1, magnetic permeability may be in a range of 100 to 5000 in a frequency range of 100 KHz to 30 MHz.

5. In the above 1, a thickness may be in a range of 10 μm to 200 μm.

6. A method for manufacturing a ferrite sheet, comprising: manufacturing a ferrite green sheet containing acicular ferrite powder; and applying a magnetic field during or after the manufacturing of the green sheet to uniaxially orient a magnetic direction.

7. In the above 6, the applying of the magnetic field may be performed together with sintering.

8. In the above 7, the sintering may be performed in a temperature range of 800° C. to 1000° C.

9. A method for manufacturing a ferrite sheet complex, comprising: attaching a protective sheet to at least one surface of the ferrite sheet manufactured according to one of the above 6 to 8; and attaching a double-sided adhesive sheet to another surface of the ferrite sheet to form a ferrite sheet complex.

10. In the above 9, the method further includes breaking a ferrite sheet in the complex into a plurality of fine pieces.

11. An electronic component comprising the ferrite sheet according to the above 1.

In accordance with the present invention, the ferrite sheet includes acicular ferrite powder and has a uniaxially-oriented magnetic orientation such that magnetic permeability and saturation magnetization can be significantly increased.

In accordance with the present invention, when the ferrite sheet is applied to a shielding sheet, magnetic field leakage can be minimized such that power efficiency of an electronic device can be significantly improved.

In accordance with the present invention, even when the ferrite sheet is formed to be thinner than a conventional ferrite sheet, the ferrite sheet can attain superior power efficiency.

DETAILED DESCRIPTION

Figure 1:
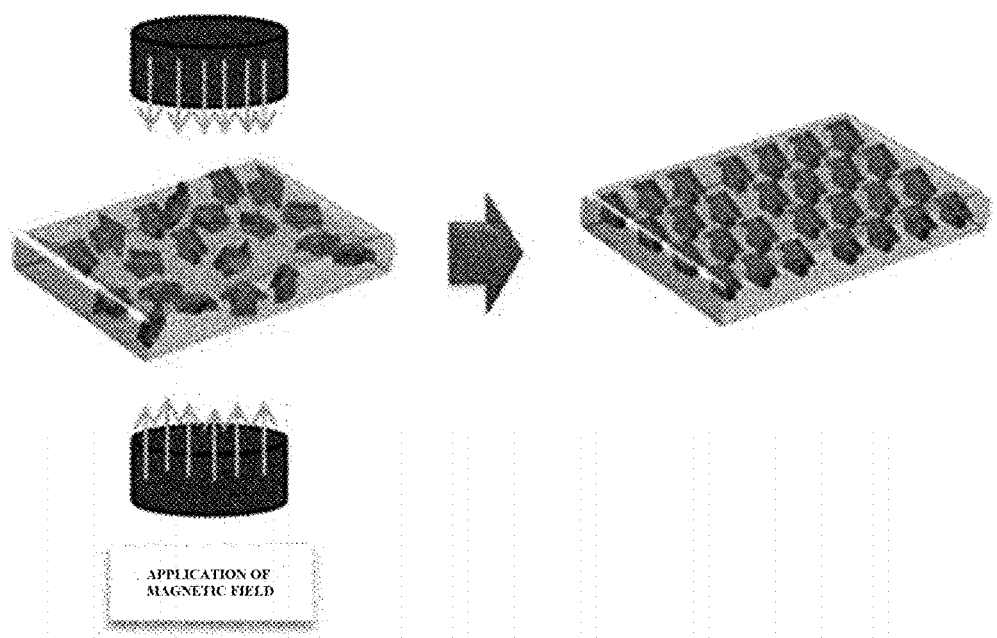
FIG. 1 is a diagram schematically illustrating a process for applying a magnetic field in a method of manufacturing a ferrite sheet according to one embodiment of the present invention.

The present invention relates to a ferrite sheet, and more particularly, to a ferrite sheet including acicular ferrite powder and having a uniaxially-oriented magnetic direction, thereby being capable of significantly increasing magnetic permeability and saturation magnetization such that, when the ferrite sheet is applied to a shielding sheet, magnetic field leakage can be minimized such that power efficiency of an electronic device can be significantly improved, and a method of manufacturing the ferrite sheet.

Hereinafter, the present invention will be described in detail with reference to preferred embodiments of the present invention, and it should be understood that these preferred embodiments are illustrative of the present invention, but are not intended to limit the scope of the appended claims, and it will be apparent to those skilled in the art that various alternations and modifications can be devised from the embodiments within the scope of the claims, and such modifications and alternations fall within the scope of the appended claims.

<Acicular Ferrite Powder>

The ferrite sheet according to the present invention contains acicular ferrite powder. The acicular ferrite powder of the present invention may be at least one selected from hard ferrite and soft ferrite, but the present invention is not limited thereto.

Specifically, when the acicular ferrite powder of the present invention is soft ferrite, the acicular ferrite powder may be at least one among soft ferrite oxides such as Ni—Zn based ferrite, Ni—Zn—Cu based ferrite, Mn—Zn based ferrite, Mg—Zn based ferrite, and Ni—Mn—Zn based ferrite, but the present invention is not particularly limited thereto.

The ferrite powder may be manufactured by various methods such as a solid phase method, a coprecipitation method, a sol-gel method, a hydrothermal synthesis method, and the like, but the present invention is not limited thereto.

<Ferrite Sheet>

The ferrite sheet of the present invention contains the acicular ferrite powder and has a uniaxially-oriented magnetic direction.

The ferrite sheet according to the present invention contains the acicular ferrite powder and has a uniaxially-oriented magnetic direction, and, when compared to a conventional sheet using spherical ferrite powder, the ferrite sheet can significantly improve magnetic permeability and saturation magnetization, thereby maximizing a shielding effect and significantly improving power efficiency of an electronic component to which the ferrite sheet is applied.

The ferrite sheet may have magnetic permeability ranging from 100 to 5,000 in a frequency range of 100 KHz to 30 MHz, and when the range is satisfied, the ferrite sheet may be suitable as a shielding sheet for wireless charging and a near-field communication.

A thickness of the ferrite sheet according to the present invention is not particularly limited, and as an example, the thickness of the ferrite sheet may be in a range of 10 μm to 200 μm. The present invention includes ferrite having the above-described form such that, when the ferrite sheet is manufactured in a thin form of the above-described thickness, superior magnetic permeability and superior saturation magnetization can be realized.

<Method for Manufacturing Ferrite Sheet>

The present invention relates to a method for manufacturing the ferrite sheet, and more particularly, the method includes manufacturing a ferrite green sheet containing acicular ferrite powder and applying a magnetic field during or after the manufacturing of the green sheet to uniaxially orient a magnetic direction.

Process for Manufacturing Ferrite Green Sheet

In this disclosure, a ferrite green sheet is formed into a sheet shape by applying a slurry for manufacturing a ferrite sheet, and the ferrite green sheet has a structure the same as that of the ferrite sheet but refers to a sheet before the process of the application of the magnetic field and sintering.

As described above, the acicular ferrite powder used in the present invention may be manufactured by a method known in the art.

The slurry for manufacturing a ferrite sheet may be manufactured by adding a solvent and a bonding agent to the acicular ferrite powder, the acicular ferrite powder may be a ferrite having the above-described components, and the solvent and the bonding agent may employ components that are conventionally used in the art without any limitation.

The slurry for manufacturing a ferrite sheet may be applied to a carrier film using a coating method such as doctor blade coating, slit coating, knife coating, spin coating, casting, microgravure coating, gravure coating, bar coating, roll coating, wire bar coating, dip coating, spray coating, nozzle coating, capillary coating, or the like; and a method such as screen printing, gravure printing, flexo printing, offset printing, ink jet coating, dispenser printing, or the like, but the present invention is not limited thereto.

Process for Applying Magnetic Field

In the present invention, the magnetic direction is uniaxially oriented due to magnetic anisotropy of the acicular ferrite powder through a process for applying a magnetic field such that magnetic permeability and saturation magnetization can be significantly increased.

FIG. 1 is a diagram schematically illustrating that a magnetic direction in a sheet is uniaxially oriented through a process for applying a magnetic field during the process for manufacturing a ferrite sheet according to one embodiment of the present invention, and the process for applying a magnetic field may be performed by disposing magnets above and below the sheet, but the present invention is not limited thereto.

The process for applying a magnetic field may be performed as a separate process during or after the process for manufacturing a green sheet (i.e., a sheet forming process), but is not limited thereto, and in order to improve the uniaxial orientation of the magnetic direction, the magnetic field may preferably be applied before the solvent of the sheet is volatilized after the green sheet is formed.

An intensity of the magnetic field required in the process of applying a magnetic field is not particularly limited, and the process of applying a magnetic field may be performed with an intensity capable of uniaxially orienting the magnetic direction of the sheet according to the present invention.

Sintering

In the present invention, the green sheet may further be subject to sintering.

When the green sheet is subject to the process of applying a magnetic field before sintering, the uniaxially oriented magnetic direction is then fixed through sintering such that orientation may be maintained even when a magnetic field is not applied.

In another embodiment of the present invention, the above-described process of applying a magnetic field may be performed together with sintering.

Figure 2:
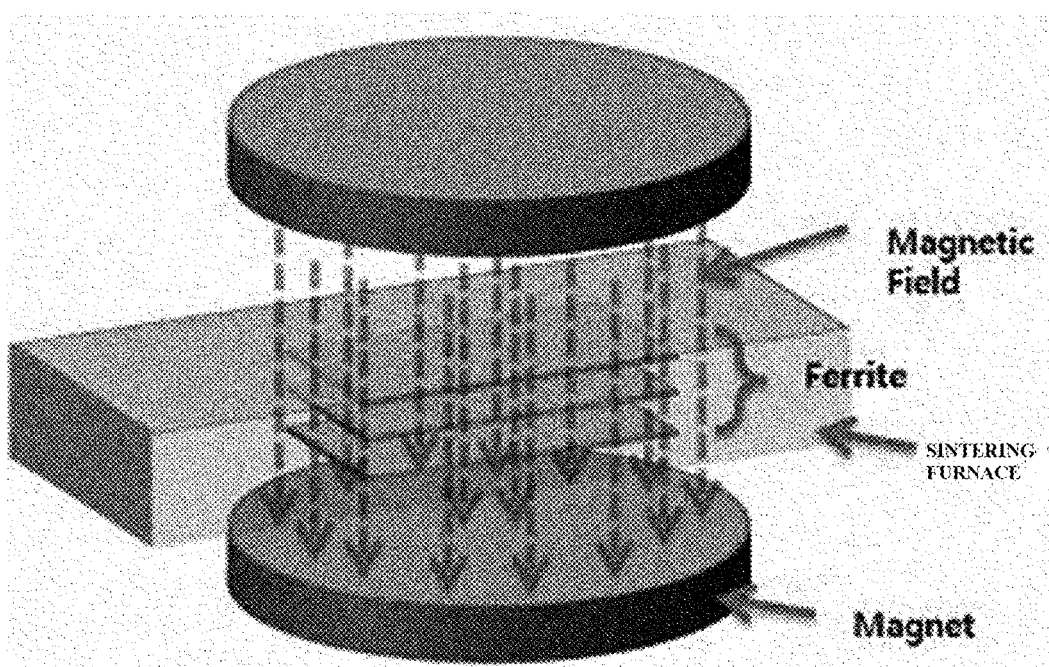
FIG. 2 is a diagram schematically illustrating a case in which the process for applying a magnetic field is performed during sintering in a method of manufacturing a ferrite sheet according to one embodiment of the present invention.

FIG. 2 is a diagram schematically illustrating that the process of applying a magnetic field is performed together with sintering during the process of manufacturing a ferrite sheet according to one embodiment of the present invention. The process of applying a magnetic field may be performed by disposing magnets above and below a sintering furnace after a sheet is put into the sintering furnace, but the present invention is not limited thereto.

Conditions for performing sintering are not particularly limited, and, for example, sintering may be performed in a temperature range of 800° C. to 1000° C., and may be performed by selecting an appropriate temperature within the above-described temperature range on the basis of composition of the acicular ferrite and process conditions. When sintering is performed in the above-described temperature range, the orientation of the magnetic direction by magnetic field application can be further improved.

<Method for Manufacturing Ferrite Sheet Complex>

The present invention relates to a method for manufacturing a ferrite sheet complex including the ferrite sheet.

A composite film may be manufactured by attaching a protective sheet to at least one surface of the ferrite sheet manufactured according to the above-described method, and by attaching a double-sided adhesive sheet to another surface of the ferrite sheet to form a ferrite sheet complex.

The protective sheet serves to protect a fragile surface of the ferrite sheet, and the double-sided adhesive sheet may be attached to another surface to which the protective sheet is attached to attach the ferrite sheet complex to an electronic device. Further, the protective sheet itself may be a double-sided adhesive sheet.

The method for manufacturing a ferrite sheet complex according to the present invention may further include breaking the ferrite sheet in the complex into a plurality of fine pieces in order to attain flexibility.

When a predetermined amount of pressure is applied to the ferrite sheet complex after the protective sheet is attached thereto, a plurality of cracks occur on an entire surface of the ferrite sheet such that the ferrite sheet is broken into a plurality of pieces. At this point, a shape of the ferrite sheet complex is maintained by the protective sheet so that the pieces of the ferrite sheet are adjacent to and separated from each other in the ferrite sheet complex. Therefore, the ferrite sheet complex is made flexible by the plurality of ferrite sheet pieces in the ferrite sheet complex.

<Electronic Component>

The present invention relates to an electronic component with the above-described ferrite sheet.

The ferrite sheet and the complex including the same according to the present invention may serve as a shielding sheet, which is one electronic component, and may provide a superior shielding function in a thin form due to superior magnetic permeability and superior saturation magnetization characteristics.

A type of electronic component according to the present invention is not particularly limited, and the electronic component may include a wireless charging device, a device used for a near-field communication, or the like.

The invention claimed is:

1. A ferrite sheet comprising an acicular ferrite powder and having a uniaxially-oriented magnetic direction,
   wherein the ferrite sheet has a height, a width and a thickness;
   the thickness has a range of 10 µm to 200 µm and is the smallest dimension of the ferrite sheet and
   the uniaxially-oriented magnetic direction is in the thickness direction.

2. The ferrite sheet of claim 1, wherein the ferrite powder includes at least one selected from the group consisting of hard ferrite and soft ferrite.

3. The ferrite sheet of claim 2, wherein the soft ferrite is at least one selected from the group consisting of Ni-Zn based ferrite, Ni-Zn-Cu based ferrite, Mn-Zn based ferrite, Mg-Zn based ferrite, and Ni-Mn-Zn based ferrite.

4. The ferrite sheet of claim 1, wherein magnetic permeability is in a range of 100 to 5000 in an entire frequency range of 100 KHz to 30 MHz.

5. An electronic component comprising the ferrite sheet according to claim 1.

6. A ferrite sheet complex, comprising:
   the ferrite sheet of claim 1,
   a protective sheet attached to at least one surface of the ferrite sheet; and
   a double-sided adhesive sheet attached to another surface of the ferrite sheet.

7. The ferrite sheet of claim 1, wherein the ferrite sheet is produced by a process comprising:
   manufacturing a ferrite green sheet comprising an acicular ferrite powder;
   applying a magnetic field in a direction vertical to the upper surface and the lower surface of the ferrite green sheet during or after the manufacturing of the ferrite green sheet to uniaxially orient a magnetic direction; and
   sintering the ferrite green sheet to prepare the ferrite sheet.

* * * * *